US009022613B2

(12) United States Patent
Komatsubara et al.

(10) Patent No.: US 9,022,613 B2
(45) Date of Patent: May 5, 2015

(54) SEMICONDUCTOR LIGHT EMITTING DEVICE COMPRISING CUT-AND-BENT PORTIONS

(71) Applicants: Shimane Prefectural Government, Matsue-shi (JP); Shimane Electronic Imafuku Works Co., Ltd., Hamada-shi (JP)

(72) Inventors: Satoshi Komatsubara, Matsue (JP); Kenichi Fukuda, Matsue (JP); Shinobu Otao, Matsue (JP); Toru Furuta, Hamada (JP)

(73) Assignees: Shimane Prefectural Government, Matsue-shi (JP); Shimane Electronic Imafuku Works Co., Ltd., Hamada-shi (JP)

(*) Notice: Subject to any disclaimer, the term of this patent is extended or adjusted under 35 U.S.C. 154(b) by 0 days.

(21) Appl. No.: 14/328,638

(22) Filed: Jul. 10, 2014

(65) Prior Publication Data
US 2014/0319552 A1 Oct. 30, 2014

Related U.S. Application Data

(62) Division of application No. 13/723,680, filed on Dec. 21, 2012, which is a division of application No. 12/934,533, filed as application No. PCT/JP2009/055517 on Mar. 19, 2009.

(30) Foreign Application Priority Data

Mar. 26, 2008 (JP) ................................. 2008-081716

(51) Int. Cl.
*F21V 29/00* (2006.01)
*H01L 33/64* (2010.01)
(Continued)

(52) U.S. Cl.
CPC .......... *H01L 33/644* (2013.01); *H01L 25/0753* (2013.01); *H01L 33/483* (2013.01);
(Continued)

(58) Field of Classification Search
CPC ........... H01L 2224/48091; H01L 2224/73265; H01L 25/0753
USPC .................................... 362/11, 555, 294, 240
See application file for complete search history.

(56) References Cited

U.S. PATENT DOCUMENTS 6,936,855 B1    8/2005  Harrah
2002/0167807 A1  11/2002  Wu
(Continued)

FOREIGN PATENT DOCUMENTS

CN    1466782 A    1/2004
EP    1387412 A1   2/2004
(Continued)

OTHER PUBLICATIONS

Extended European Search Report issued in European Patent Application No. 09724576.5 dated Jan. 8, 2014.
(Continued)

*Primary Examiner* — Kenneth Parker
*Assistant Examiner* — David Chen
(74) *Attorney, Agent, or Firm* — Venable LLP; Michael A. Sartori; Tamatane J. Aga

(57) ABSTRACT

Provided are a semiconductor light emitting module and a method of manufacturing the same, which allow achieving high luminance light emission as well as lightweight and compact features. In a semiconductor light emitting module (101), a projecting portion (202) serving as a reflecting member is formed on a metal thin plate (102) to surround a semiconductor light emitting element (104). The semiconductor light emitting element (104) is connected to a printed board (103) by using a wire (201), for example. The projecting portion (202) is formed by pressing and bending the metal thin plate (102) from a back surface, for example, to surround the element and to be higher than the semiconductor light emitting element (104).

3 Claims, 23 Drawing Sheets

(51) Int. Cl.
  *H01L 25/075* (2006.01)
  *H01L 33/60* (2010.01)
  *H05K 1/02* (2006.01)
  *H01L 33/48* (2010.01)
  *H01L 33/62* (2010.01)
  *F21K 99/00* (2010.01)
  *F21Y 101/02* (2006.01)
  *F21Y 105/00* (2006.01)

(52) U.S. Cl.
  CPC .............. *H01L 33/60* (2013.01); *H01L 33/641* (2013.01); *H01L 2224/48091* (2013.01); *H01L 2224/48247* (2013.01); *H01L 2224/8592* (2013.01); *H01L 33/62* (2013.01); *H01L 33/642* (2013.01); *H05K 1/021* (2013.01); *H05K 2201/09054* (2013.01); *H05K 2201/10106* (2013.01); *H05K 2203/0323* (2013.01); *F21K 9/00* (2013.01); *F21Y 2101/02* (2013.01); *F21Y 2105/001* (2013.01)

(56) References Cited

U.S. PATENT DOCUMENTS

| | | | |
|---|---|---|---|
| 2003/0193803 A1* | 10/2003 | Lin | ............... 362/250 |
| 2004/0065894 A1 | 4/2004 | Hashimoto et al. | |
| 2004/0159850 A1 | 8/2004 | Takenaka | |
| 2004/0170019 A1 | 9/2004 | Tamai | |
| 2004/0208210 A1 | 10/2004 | Inoguchi | |
| 2004/0264195 A1 | 12/2004 | Chang et al. | |
| 2005/0073846 A1 | 4/2005 | Takine | |
| 2005/0186407 A1 | 8/2005 | Mori et al. | |
| 2005/0211991 A1 | 9/2005 | Mori et al. | |
| 2005/0263786 A1 | 12/2005 | Isoda | |
| 2006/0214879 A1 | 9/2006 | Sugimoto et al. | |
| 2006/0220046 A1 | 10/2006 | Yu et al. | |
| 2007/0145398 A1 | 6/2007 | Shin | |
| 2007/0252157 A1 | 11/2007 | Chang et al. | |
| 2008/0019133 A1 | 1/2008 | Kim et al. | |
| 2008/0054287 A1 | 3/2008 | Oshio et al. | |
| 2008/0128739 A1 | 6/2008 | Sanpei et al. | |
| 2008/0258169 A1 | 10/2008 | Masuko | |

FOREIGN PATENT DOCUMENTS

| | | | |
|---|---|---|---|
| EP | 1439584 | A1 | 7/2004 |
| EP | 1928026 | A1 | 6/2008 |
| EP | 1978566 | A1 | 10/2008 |
| EP | 2023409 | A1 | 2/2009 |
| JP | 11-298048 | A | 10/1999 |
| JP | 2003-152225 | A | 5/2003 |
| JP | 2005-243744 | A | 9/2005 |
| JP | 2005-277331 | A | 10/2005 |
| JP | 2006-269785 | A | 10/2006 |
| JP | 2007-096240 | A | 4/2007 |
| JP | 2007-180320 | A | 7/2007 |
| JP | 2007-201171 | A | 8/2007 |
| JP | 2007-281260 | A | 10/2007 |
| WO | WO-03/023857 | A2 | 3/2003 |
| WO | WO-03/030274 | A1 | 4/2003 |
| WO | WO-2004/088761 | A1 | 10/2004 |
| WO | WO-2007/000037 | A1 | 1/2007 |
| WO | WO-2007/086229 | A1 | 8/2007 |
| WO | WO-2007126074 | A1 | 11/2007 |

OTHER PUBLICATIONS

Office Action issued in U.S. Appl. No. 13/723,680 dated Feb. 6, 2014.
Office Action issued in U.S. Appl. No. 13/723,680 dated Jul. 8, 2013.
Office Action issued in U.S. Appl. No. 12/934,533 dated Mar. 17, 2014.
Office Action issued in U.S. Appl. No. 12/934,533 dated Nov. 26, 2013.
Office Action issued in U.S. Appl. No. 12/934,533 dated Aug. 5, 2013.
Office Action issued in U.S. Appl. No. 12/934,533 dated Dec. 18, 2012.
Office Action issued in U.S. Appl. No. 12/934,533 dated Jul. 3, 2014.
Office Action issued in U.S. Appl. No. 13/723,680, dated Oct. 6, 2014.
Extended European Search Report issued in European Patent Application No. 14181596.9 dated Dec. 2, 2014.

* cited by examiner

| | REFLECTIVITY OF REFLECTION PLATE | FOUND VALUE OF TOTAL LUMINOUS FLUXES | LUMEN/W |
|---|---|---|---|
| ROLLED ALUMINUM (VALUE IN DOCUMENT) | 75% | 3.011 LUMENS | 51 LUMENS/W |
| MIRO2 (VALUE IN CATALOGUE) | 95% | 6.014 LUMENS | 102 LUMENS/W |
| MIRO2-Silver (VALUE IN CATALOGUE) | 98% | 6.701 LUMENS | 114 LUMENS/W |

FIG.9

(VALUE IN DOCUMENT)

| REFLECTIVITY OF REFLECTION PLATE | AFTER FIRST REFLECTION | AFTER SECOND REFLECTION | AFTER THIRD REFLECTION |
|---|---|---|---|
| 60% | 60% | 36% | 22% |
| 75% | 75% | 56% | 42% |
| 95% | 95% | 90% | 86% |

FIG.10

■ RESULT OF LUMINOUS EFFICIENCY TEST - DIFFERENCE AMONG PLATINGS ON LED BONDING SURFACE

|  | WHEN NEAR-ULTRAVIOLET LED (405 nm) IS LIGHT SOURCE | | WHEN BLUE LED (460 nm) IS LIGHT SOURCE | |
|---|---|---|---|---|
|  | VALUE MEASURED WITH INTEGRATING SPHERE | | VALUE MEASURED WITH INTEGRATING SPHERE | |
|  | MEASUREMENT VALUE (lm) | COMPARISON (%) | MEASUREMENT VALUE (lm) | COMPARISON (%) |
| MIRO2-Silver | 6.72 | 100.0 | 5.55 | 100.0 |
| SILVER PLATING FOR BONDING | 5.56 | 82.7 | 4.42 | 79.6 |
| GOLD PLATING FOR BONDING (REFERENCE DATA) | 3.23 | 48.1 | 2.30 | 41.4 |

DATA MEASURED WHEN ENTIRE LED MOUNTING SURFACE IS PLATED TO BE REFLECTING SURFACE LUMINANCE IS DECREASED CORRESPONDING TO AREA OF INSULATION PORTION WHEN BONDING PATTERN IS FORMED AS IN CHIP LED OR COB SUBSTRATE.

FIG.11

■ RESULT OF TEMPORAL CHANGE TEST – DIFFERENCE BETWEEN PLATINGS ON LED BONDING SURFACE

| IN CASE OF PRESENT EMBODIMENT | WHEN NEAR-ULTRAVIOLET LED (405 nm) IS LIGHT SOURCE | | WHEN BLUE LED (460 nm) IS LIGHT SOURCE | |
|---|---|---|---|---|
| | VALUE MEASURED WITH INTEGRATING SPHERE | | VALUE MEASURED WITH INTEGRATING SPHERE | |
| | MEASUREMENT VALUE (lm) | COMPARISON (%) | MEASUREMENT VALUE (lm) | COMPARISON (%) |
| MIRO2-Silver | 6.72 | 100.0 | 5.55 | 100.0 |
| MIRO2-Silver AFTER HIGH TEMPERATURE/ HIGH HUMIDITY TEST | 6.29 | 93.6 | 5.23 | 94.2 |

FIG.12

■ RESULT OF TEMPORAL CHANGE TEST – DIFFERENCE BETWEEN PLATINGS ON LED BONDING SURFACE

| IN CASE OF CONVENTIONAL TECHNIQUE | WHEN NEAR-ULTRAVIOLET LED (405 nm) IS LIGHT SOURCE | | WHEN BLUE LED (460 nm) IS LIGHT SOURCE | |
|---|---|---|---|---|
| | VALUE MEASURED WITH INTEGRATING SPHERE | | VALUE MEASURED WITH INTEGRATING SPHERE | |
| | MEASUREMENT VALUE (lm) | COMPARISON (%) | MEASUREMENT VALUE (lm) | COMPARISON (%) |
| SILVER PLATING FOR BONDING | 5.56 | 100.0 | 4.42 | 100.0 |
| SILVER PLATING FOR BONDING AFTER HIGH TEMPERATURE / HIGH HUMIDITY TEST | 4.39 | 79.0 | 3.40 | 76.9 |

FIG.13

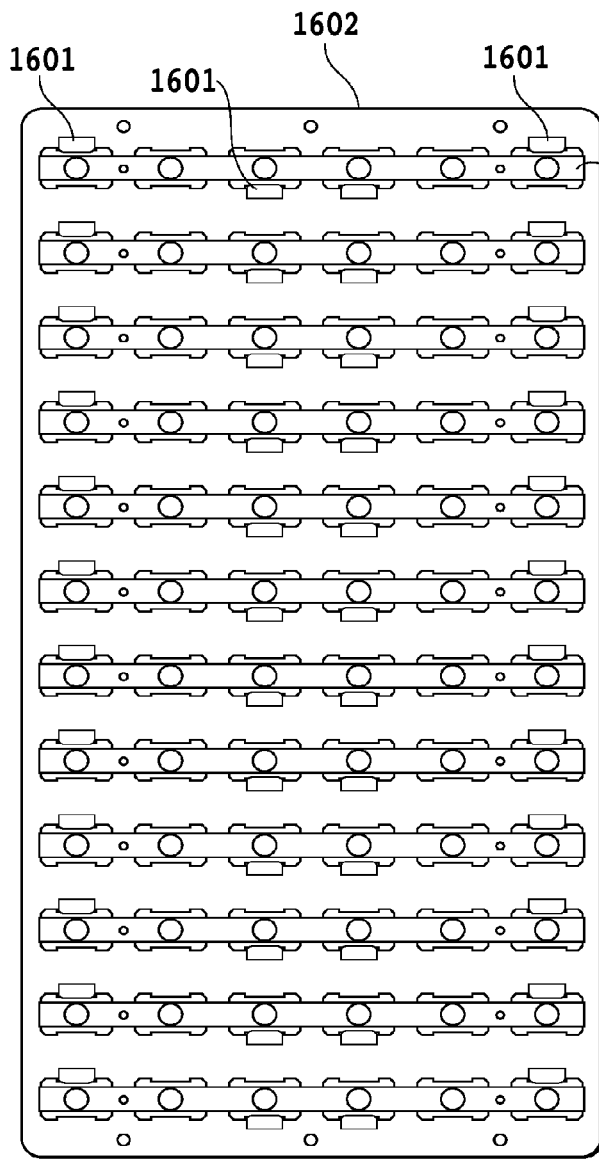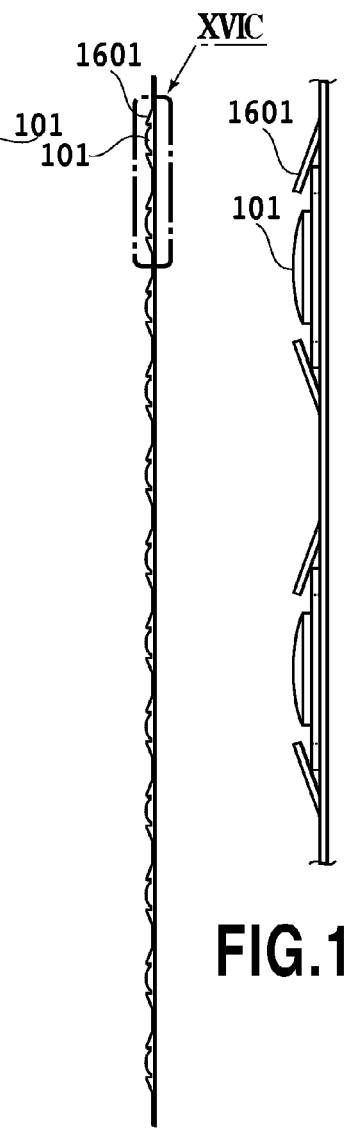
FIG.16A FIG.16B FIG.16C

SEMICONDUCTOR LIGHT EMITTING DEVICE COMPRISING CUT-AND-BENT PORTIONS

CROSS-REFERENCE TO RELATED APPLICATIONS

This application is a divisional of U.S. patent application Ser. No. 13/723,680 filed on Dec. 21, 2012, which is a divisional of U.S. patent application Ser. No. 12/934,533 filed on Sep. 24, 2010, which is a National Stage of International Application No. PCT/JP2009/055517, which claims the benefit of Japanese Patent Application No. 2008-081716 filed on Mar. 26, 2008, all of which are incorporated herein by reference in their entirely.

TECHNICAL FIELD

The present invention relates to a semiconductor light emitting module and a method of manufacturing the same, or more specifically, to a semiconductor light emitting module and a method of manufacturing the same which enable high luminance light emission.

BACKGROUND ART

In recent years, semiconductor light emitting elements such as light emitting diodes (LED) having high energy efficiency in light emission have been used in various fields, and various apparatuses utilizing such semiconductor light emitting elements have been developed. Emitting light with large currents or efficiently emitting light with reflectors or the like, in particular, semiconductor light emitting elements have drawn attention toward their use as lighting substituting for conventional fluorescent lamps or incandescent lamps, and techniques intended to resolve a problem of heat generated by light emission have been proposed to date.

For example, there is proposed a light emitting device having heat dissipation properties improved as compared to conventional devices and being capable of efficiently extracting light from a semiconductor light emitting element to the outside (see Patent Document 1, for example). In the light emitting device, a metal plate made of aluminum is provided with a projection that protrudes forward, and a housing recess is formed on the front side of the projection. The housing recess has a semiconductor light emitting element mounted on a bottom surface thereof. The LED element is thermally coupled to the metal plate. A printed circuit board made of a glass epoxy substrate is joined to the front surface of the metal plate. Meanwhile, a LED-mounting printed board for mounting a LED is proposed which allows manufacturing an illumination light source having excellent heat dissipation properties while receiving less heat deterioration even with increased light emission intensity (see Patent Document 2, for example). In the LED-mounting printed board, a wiring pattern to be electrically connected to a LED is provided on one side of an insulating layer, and a heat dissipation metal layer for releasing heat generated from the LED is provided on the other side of the insulating layer. A LED-mounting concave portion is formed to penetrate the insulating layer from the side of the wiring pattern and reach inside of the heat dissipation metal layer.

Further, there is proposed a light emitting device having excellent light extraction efficiency, color temperature, and color rendering index and having favorable radiant intensity of emitted light (see Patent Document 3, for example). The light emitting device includes: a base in which a mounting portion for mounting a light emitting element is formed on an upper surface thereof; a frame-shaped reflective member joined to an outer peripheral portion on the upper surface of the base so as to surround the mounting portion and provided with an inner peripheral surface serving as a reflecting surface to reflect light emitted from the light emitting element; the light emitting element mounted on the mounting portion; and a translucent member made of resin which has viscosity before hardening in a range from 0.4 Pa·s to 50 Pa·s and contains a phosphor having density in a range from 3.8 g/cm$^3$ to 7.3 g/cm$^3$ which converts wavelength of the light emitted from the light emitting element.

However, in the light emitting diode module according to the invention of Patent Document 1, since the printed board is attached to the front surface of the surfaces thereof, the heat generated from the element is transmitted to the metal plate and is further dissipated by using the front surface via the printed board having low heat conductivity. Hence there is a drawback that heat dissipation from the front surface cannot be effectively performed.

Meanwhile, an invention is also proposed such as the invention of Patent Document 2 or 3 in which the concave portion is formed and the light emitting diode chip is bonded in the concave portion for effectively using light emitted from the light emitting diode chip. However, in these methods, the metal plate or the like that constitutes the base needs to have a thickness equal to or more than a height of a dent of the concave portion as the semiconductor light emitting module because of its structure or manufacturing processes. This prevents creating a lightweight semiconductor light emitting module.

An object of the present invention is to provide a semiconductor light emitting module and a method of manufacturing the same, which allow maintaining higher reflectivity, obtaining uniform white light, achieving high luminance light emission by improving light extraction efficiency, while having lightweight and thin features.

Patent Document 1: Japanese Patent Laid-Open No. 2003-152225

Patent Document 2: Japanese Patent Laid-Open No. 2005-243744

Patent Document 3: Japanese Patent Laid-Open No. 2005-277331

DISCLOSURE OF THE INVENTION

In order to achieve the above object, the invention according to claim 1 provides a semiconductor light emitting module characterized by including: a semiconductor light emitting element; a plate on which each semiconductor light emitting element is disposed in contact with a surface of the plate; and a board covering a certain portion of the surface of the plate excluding a portion for each semiconductor light emitting element and a neighborhood of the element, being electrically connected to each semiconductor light emitting element, and serving as an electrode to supply the electric power, the board formed to cover the certain portion of the plate having an area smaller than a portion of the plate excluding the portion for each semiconductor light emitting element and the neighborhood of the element, so as to partially expose the plate.

The invention according to claim 2 is characterized in that, in the semiconductor light emitting module according to claim 1, the plate has a high reflection coating formed on the surface thereof so as to reflect light from the semiconductor light emitting element.

The invention according to claim 3 provides a semiconductor light emitting module characterized by including: multiple semiconductor light emitting elements; multiple plates on which the respective semiconductor light emitting elements are disposed in contact with surfaces of the plates; and a single board covering certain portions of the surfaces of the respective multiple plates excluding portions for the respective semiconductor light emitting elements and neighborhoods of the elements, being electrically connected to the semiconductor light emitting elements, and serving as an electrode to supply the electric power, the board connecting the multiple plates to each other and being formed to cover the certain portion of each of the plates having an area smaller than a portion of the plate excluding the portion for the corresponding semiconductor light emitting element and the neighborhood of the element, so as to partially expose the plate.

The invention according to claim 4 is characterized in that, in the semiconductor light emitting module according to claim 3, the multiple plates are disposed in an array form, and a width of each of the multiple plates longitudinally arranged in the array form is greater than a width of the single board.

The invention according to claim 5 is characterized in that, in the semiconductor light emitting module according to claim 3, each of the plates has a high reflection coating formed on the surface thereof so as to reflect light from the corresponding semiconductor light emitting element.

The invention according to claim 6 provides a semiconductor light emitting module characterized by including: a semiconductor light emitting element; a plate on which the semiconductor light emitting element is disposed in contact with a surface of the plate, in a region surrounded by a projecting portion formed to have an inclined surface forming an obtuse angle with the surface and to be higher than the semiconductor light emitting element; and a board covering a certain portion of the surface of the plate excluding the region surrounded by the projecting portion, being electrically connected to each semiconductor light emitting element, and serving as an electrode to supply the electric power.

The invention according to claim 7 is characterized in that, in the semiconductor light emitting module according to claim 6, the plate has a high reflection coating formed on the surface thereof so as to reflect light from the semiconductor light emitting element.

The invention according to claim 8 is characterized by further including, in the semiconductor light emitting module according to claim 6, a high reflection paint portion formed by applying high reflection paint in a contact position between the projecting portion and the board so as to reflect light from the semiconductor light emitting elements.

The invention according to claim 9 is characterized by further including, in the semiconductor light emitting module according to claim 6, a convex reflector provided on the board outside the region surrounded by the projecting portion so as to surround the region, the convex reflector obtained by forming a reflective material into a convex shape.

The invention according to claim 10 provides a semiconductor light emitting module manufacturing method for manufacturing a semiconductor light emitting module in which a semiconductor light emitting element is integrally incorporated, characterized by including the steps of: forming a projecting portion on a plate, the projecting portion including an inclined surface forming an obtuse angle formed with a surface of the plate, the projecting portion being higher than the semiconductor light emitting element; disposing the semiconductor light emitting element in a region surrounded by the projecting portion so that the semiconductor light emitting element is in contact with the surface of the plate; and disposing a board covering a certain portion of the surface of the plate excluding the region surrounded by the projecting portion, being electrically connected to the semiconductor light emitting element, and serving as an electrode to supply electric power.

The invention according to claim 11 is characterized in that, in the semiconductor light emitting module manufacturing method according to claim 10, in the step of forming a projecting portion, the projecting portion is formed by pressing sheet metal into such a shape as to reflect and condense light emitted from the semiconductor light emitting element.

The invention according to claim 12 is characterized in that, in the semiconductor light emitting module manufacturing method according to claim 10, the plate is made to reflect light from the semiconductor light emitting element by forming a high reflection coating on the surface.

The invention according to claim 13 is characterized by further including, in the semiconductor light emitting module manufacturing method according to claim 10, a high reflection paint step of applying high reflection paint to a contact position between the projecting portion and the board to reflect light from the semiconductor light emitting element.

The invention according to claim 14 provides a semiconductor light emitting module characterized by including: a semiconductor light emitting element; a plate on which the semiconductor light emitting element is disposed in contact with a surface of the plate; a board covering a certain portion of the surface of the plate excluding a certain region including a portion where the semiconductor light emitting element is disposed, being electrically connected to each semiconductor light emitting element, and serving as an electrode to supply the electric power; and a high reflection paint portion formed to reflect light from the semiconductor light emitting element, by applying high reflection paint to cover a gap formed between the board and the plate in contact with each other in a periphery of the certain region.

The invention according to claim 15 is characterized in that, in the semiconductor light emitting module according to claim 14, the plate has a high reflection coating formed on the surface thereof so as to reflect light from the semiconductor light emitting element.

BRIEF DESCRIPTION OF THE DRAWINGS

FIG. 9 is a view showing results obtained by measuring luminance by using three types of materials of reflecting plates in order to confirm an effect of the present invention;

FIG. 10 is a view for explaining an aspect that the higher the reflectivity of the reflecting plate of this embodiment, the more the attenuation of the amount of reflected light after repetition of reflection can be suppressed;

FIG. 11 is a view showing a result of a difference in luminous efficiency of this embodiment among platings;

FIG. 12 is a view showing a result of a difference in luminous efficiency of this embodiment among platings;

FIG. 13 is a view showing a result of a difference in luminous efficiency of this embodiment among platings;

FIG. 16A is a front view showing a dissipater plate to which the semiconductor light emitting modules of this embodiment are fixed by use of cut-and-bent portions;

FIG. 16B is a lateral side view showing the dissipater plate to which the semiconductor light emitting modules of this embodiment are fixed by use of the cut-and-bent portions;

FIG. 16C is a partially enlarged view of the lateral side view of the dissipater plate to which the semiconductor light emitting modules of this embodiment are fixed by use of the cut-and-bent portions;

BEST MODE FOR CARRYING OUT THE INVENTION

First Embodiment (A Structure of a Semiconductor Light Emitting Module)

Figure 1:
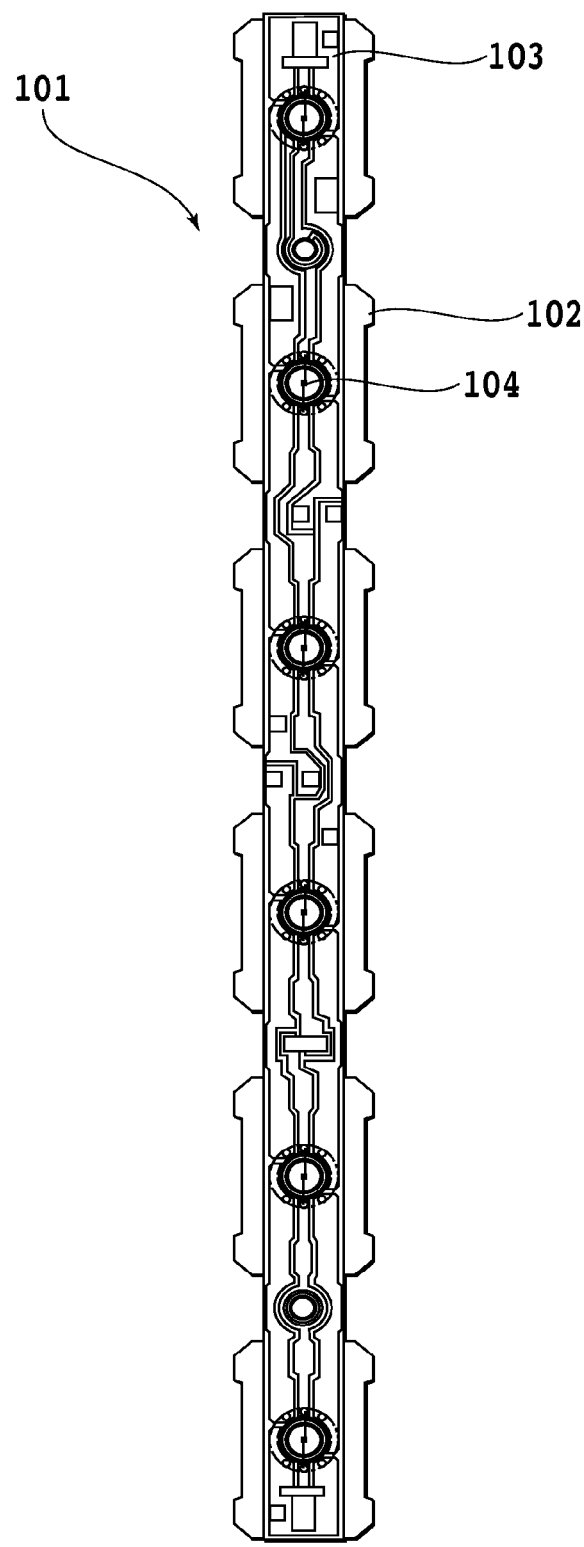
FIG. 1 is a top view showing a semiconductor light emitting module in the form of array according to an embodiment of the present invention.

FIG. 1 is a top view showing a structure of a semiconductor light emitting module according to an embodiment of the present invention. A semiconductor light emitting module 101 of this embodiment includes metal thin plates 102 configured to dissipate heat and provided with a light reflecting function, and a printed board 103 configured to cover the metal thin plates 102 and to supply electric power to semiconductor light emitting elements 104 disposed on the metal thin plates. The semiconductor light emitting elements 104, such as light-emitting diodes, to be actually energized to emit light are electrically connected to the printed board 103. In this embodiment, the printed board 103 is formed into a vertically long shape as shown in FIG. 1, and the metal thin plates 102 are attached thereto in an array form. Here, as can be understood by referring to FIG. 1, the metal thin plates 102 are structurally formed into such shapes that surfaces thereof protrude from the printed board 103 being an insulator. In other words, as a result of employing this configuration, although the metal thin plates 102 require a certain area, the printed board 103 does not require the same area as the metal thin plates as long as the printed board 103 is able to insulate the metal thin plates 102 and to connect the multiple metal thin plates 102. Note that, if elements and components are mounted which are necessary in terms of a wiring pattern and a circuit configuration, an area for the mounting is needed.

Any material can be used for each metal thin plate 102 and the metal thin plate 102 can be formed into any shape as long as the metal thin plate 102 is provided with a certain heat dissipation property as heat dissipating media and provided with a light reflecting function. In this embodiment, the metal thin plate 102 is formed by processing, with various methods, metal such as iron, silver, copper, or aluminum, or an alloy thereof, or a composite material obtained by combining any of the metal and the alloy with a carbon-based material in order to further enhance heat conductivity. For this reason, in the semiconductor light emitting module of this embodiment, heat generated by light emission is efficiently discharged mainly from a lower surface side of the semiconductor light emitting module but, in addition, the heat is also dissipated from an upper surface thereof because metal portions of portions not covered with the printed board are directly exposed, thereby enabling extremely efficient heat dissipation. Furthermore, as will be described later, the metal thin plate can also be processed and shaped by using an extrusion mold material or formed by sheet metal folding. However, without limitations to the foregoing, any method known in the relevant technical fields is applicable as long as such a method can attain the object of the invention of the present application.

Here, it is possible to extract a sufficient amount of light if the metal thin plate 102, which is also a highly reflective plate, has a high light reflecting capability and total reflectivity equal to or above 95%. However, it is preferable to set the total reflectivity equal to or above 98%. The metal thin plate 102 can be mounted by forming an adhesive layer on an aluminum base material, forming a pure aluminum layer or a pure silver layer, and further forming a high reflection coating by vapor depositing titanium oxide or silicon oxide, for example. This high reflection coating allows reducing deterioration of pure aluminum or pure silver in the inner layer due to oxidation, thus maintaining initial reflectivity for a longer period and stabilizing product quality.

The metal thin plate 102 can be manufactured by forming the high reflection coating on metal finished into an intended shape by press work or the like by vapor depositing titanium oxide or silicon oxide on the adhesive layer and the layer of pure aluminum or the pure silver which are described above, for example. Alternatively, the metal thin plate 102 can be manufactured by forming such a high reflection coating on metal either in a plate shape or a coil shape and then finishing the metal into an intended shape by press work or the like. MIRO2-SILVER and MIRO2 made by Alanod GmbH & Co. KG used in an example of this embodiment have total reflectivity equal to 98% and 95%, respectively. As for the metal thin plate used in the invention of the present application, any material known in the relevant technical fields is applicable in addition to the products made by Alanod GmbH & Co. KG as long as such a material can attain the object of the invention of the present application. Here, it is also possible to use the metal thin plate 102 itself as one of electrodes by connecting a conductive wire 201 to the metal thin plate 102.

As for the printed board 103, any material known in the relevant technical fields is applicable as long as such a material electrically insulates at least the metal thin plates 102 and is formed into a shape to have a hole for transmitting at least the light emitted from the semiconductor light emitting element 104 to the outside. For example, the printed board 103 can be formed by fabricating a board of FR4, polyimide, or the like having the shape shown in FIG. 1, and disposing the board on the metal thin plates 102. Alternatively, an insulating layer can be formed as a part of the printed board 103 by using an adhesive having an insulating function, the insulating layer bonding a power distribution film and the metal thin plates 102 and insulating the power distribution film from the metal thin plates 102.

Naturally, the printed board 103 can be formed by using a general printed board. In any case, any method known in the relevant technical fields is applicable for formation of the printed board and for connection between the metal thin plate 102 and the semiconductor light emitting element 104.

Figure 2:
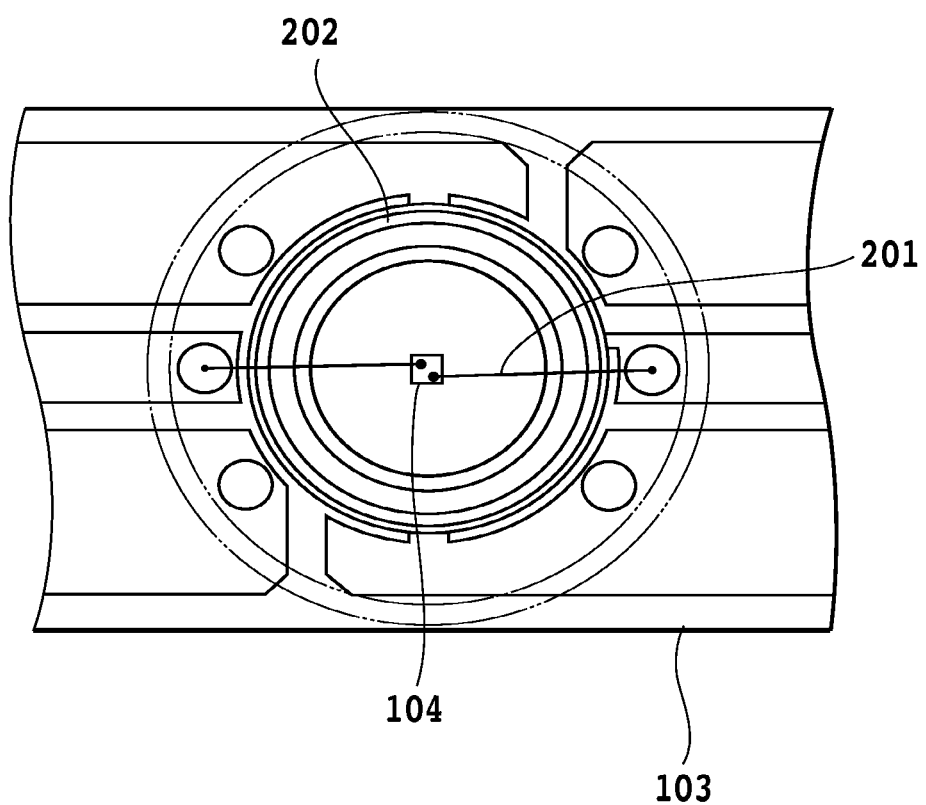
FIG. 2 is a front view showing a structure of the semiconductor light emitting module according to the embodiment of the present invention.
Figure 3:
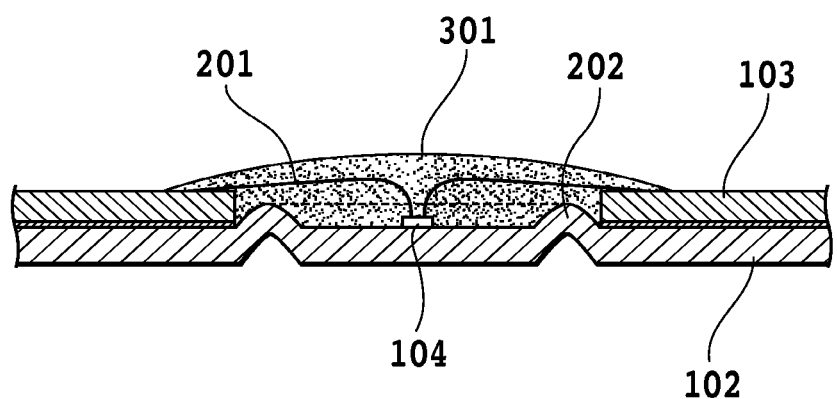
FIG. 3 is a lateral side view showing the structure of the semiconductor light emitting module according to the embodiment of the present invention.

The basic structure of the semiconductor light emitting module 101 of this embodiment has been described above with reference to FIG. 1. In practice, in the semiconductor light emitting module 101 as shown in FIG. 2, a projecting portion 202 serving as a reflecting member is formed on the metal thin plate 102 so as to surround the semiconductor light emitting element 104, and the semiconductor light emitting element 104 is connected to the printed board 103 by using a wire 201, for example. The above-described semiconductor light emitting module satisfies a function basically in this condition. However, with reference to FIG. 3, it is also possible to fill a material 301 such as resin known in the relevant technical fields into a portion of a transmission hole in the state exposed to the outside in order to protect the element and a bonding wire portion and due to some other reasons, which will be described later. Here, silicone or epoxy is applicable as the material 301 used for filling.

Figure 7A:
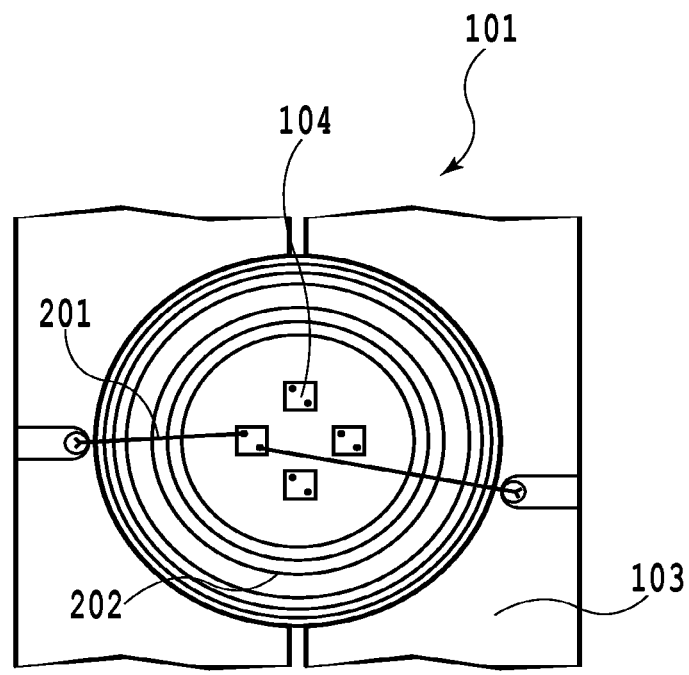
FIG. 7A is a front view showing a structure of a still different example of the semiconductor light emitting module according to this embodiment.

Moreover, as shown in FIG. 1, this embodiment provides the semiconductor light emitting module having 6 light sources, which includes the six metal thin plates 102, the single printed board 103 having holes for allowing the light from the semiconductor light emitting elements 104 to pass through, and the six semiconductor light emitting elements 104. However, without limitation to the foregoing, any number, including one, of the semiconductor light emitting elements may be used. Meanwhile, as shown in FIG. 7A, it is also possible to mount the semiconductor light emitting elements of multiple different color types, such as three color types, on the single metal thin plate 102 and to achieve full-color light emission by using the single metal thin plate 102.

(A Manufacturing Method of a Semiconductor Light Emitting Module)

Figure 4:
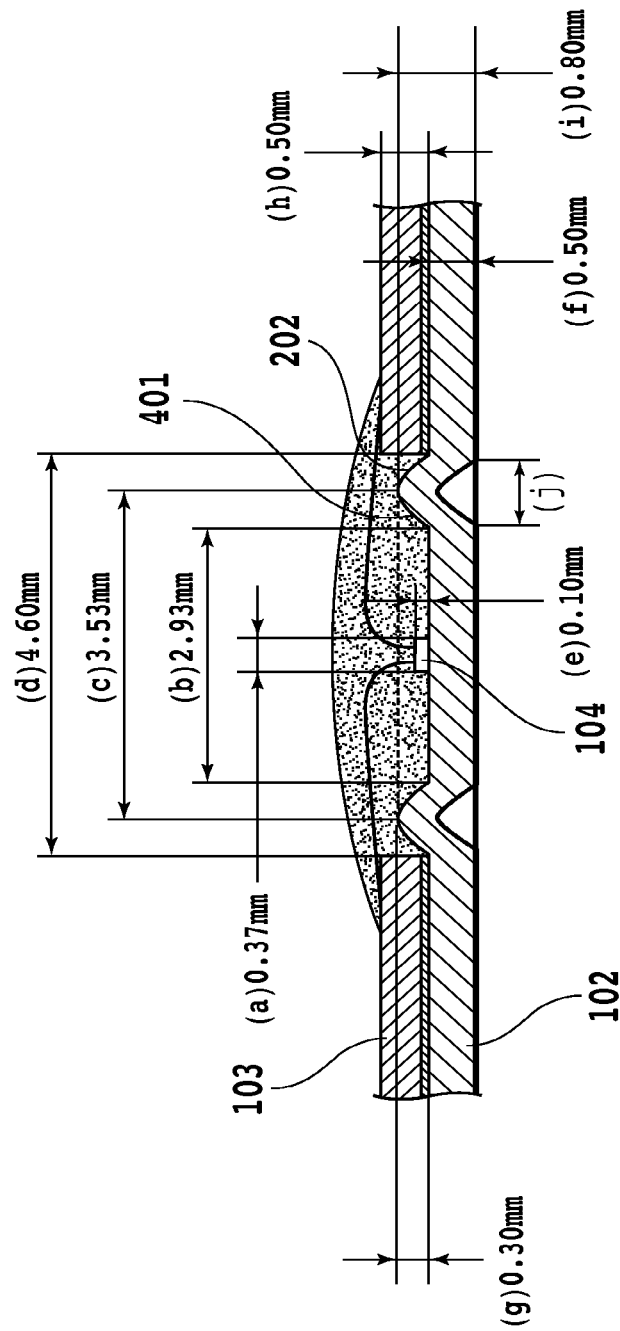
FIG. 4 is a lateral side view showing dimensions of the semiconductor light emitting module according to the embodiment of the present invention.

As shown in FIG. 4, a portion of the metal thin plate 102 in which to bond the element 104 is formed into a flat portion in this embodiment. First, the projecting portion 202 is formed around the semiconductor light emitting element 104. This projecting portion 202 is formed by pressing and bending the metal thin plate 102 from a back surface side so that the projecting portion 202 may surround the periphery of the element and become higher than the semiconductor light emitting element 104. Referring to the flat portion shown in FIG. 3 and FIG. 4 in which to bond the semiconductor light emitting element 104, the back surface of the metal plate in the flat portion in which to bond the semiconductor light emitting element 104 is located on the same plane as that in a portion outside the periphery of the projecting portion. Accordingly, an ultrasonic bonding can be performed without preparation of complicated jigs and tools in bonding of the semiconductor light emitting element 104. As described above, in this embodiment, the metal thin plate 102 is pressed and bent from the surface on the backside of the surface to mount the semiconductor light emitting element 104. Thus, an angle formed between the surface of the flat portion and an inclined surface 401 generated by the projecting portion 202 becomes an obtuse angle. This plays a role as a reflecting plate to efficiently reflect the light emitted from the semiconductor light emitting element 104 forward (upward in FIG. 4).

Figure 5A:
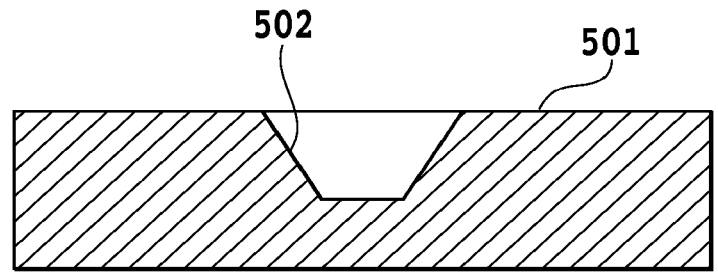
FIG. 5A is a view for explaining an advantage of using a metal thin plate of this embodiment.
Figure 5B:
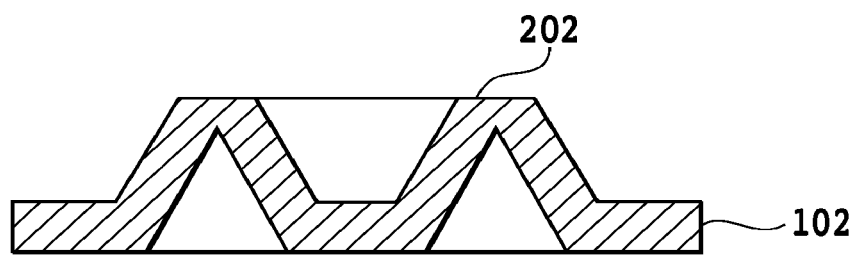
FIG. 5B is a view for explaining the advantage of using the metal thin plate of this embodiment.

In addition, according to this method of forming the projecting portion around the flat portion for die bonding the semiconductor light emitting element 104, it is possible to use a thinner plate as compared to the conventional technique and to achieve a lightweight module. For example, as shown in a conventional module shape of FIG. 5A, a block having a certain thickness is needed for a base 501 of the module in order to form a dent 502 that also functions as a reflective member. In contrast, the metal thin plate 102 can be used for a module shape shown in FIG. 5B representing the example of this embodiment. This allows forming a much lighter and more compact module. This is also an essential technique for rendering the metal thin plate 102, which has a surface subjected to processing to form a high reflection coating to be described later, usable as a base member for die bonding the semiconductor light emitting element 104. If a metal thin plate having a high reflection coating formed thereon in advance is subjected to bending work, the high reflection coating on its surface causes cracks and fails to ensure adequate brightness as the semiconductor light emitting module. However, since the surface on which to die bond the semiconductor light emitting element 104 is a plane or substantial plane identical to the initial plane, deterioration such as cracks can be minimized. In addition, since the surface is a plane, an adhesion property and a heat dissipation property can be enhanced in heat dissipation by bonding of a casing serving as heat dissipation plate or the like to the metal thin plate 102. For example, as shown in FIG. 16A, cut-and-bent portions 1601 are formed on a heat dissipation plate 1602 and the semiconductor light emitting modules 101 are sandwiched between the cut-and-bent portions 1601 so as to closely contact the dissipation plate 1602. This establishes the structure capable of achieving easy fixation and a favorable heat dissipation property. Specifically, as shown in FIG. 16C which is an enlarged view of a lateral side view FIG. 16B, the semiconductor light emitting module 101 is fixed by being sandwiched between the cut-and-bent portions 1601. In this case, the base surface of the semiconductor light emitting module 101 of this embodiment maintains the plane, which works effectively for the above-described heat dissipation. Therefore, the use of the forming method and the structure described above allows using a relatively inexpensive material having the high reflection coating formed thereon in advance.

As described previously, paths for transferring the heat generated from the semiconductor light emitting element 104 include a path which transfers the heat to the back surface for heat dissipation and a path which dissipates the heat from a front surface. When this module is used while being brought in close contact with a casing serving as a heat sink or a heat dissipation surface, it is preferable to set large an area where the semiconductor light emitting module is in contact with the casing serving as the heat sink or the heat dissipation surface in order to dissipate the heat from the back surface. Hence a width (b) of a portion surrounded by the projecting portion needs to be optimized according to the size and number of chips to be mounted thereon. For example, in the case of mounting 3 chips each having a width (a) about 0.3 mm, about 3 mm is preferable for the width (b). In the case of mounting 6 chips, about 5 mm is preferable for the width (b). Meanwhile, a height of the projecting portion 202 is limited to some extent according to the forming method of this embodiment. Hence, in consideration of the light reflecting function of the inclined surface 401, it is not preferable to form, into a very large area, the flat portion to mount the semiconductor light emitting element 104. However, it is preferable to set a width of the projecting portion (a length (j) in FIG. 4) as small as possible.

In consideration of the above-described points, the module having dimensions as shown in FIG. 4 is used in this embodiment. However, without limitation to the foregoing, the module can have any dimensions within a range allowing forming such a projecting portion that the height of the projecting portion (which is 0.3 mm as indicated with (g) in the example in FIG. 4) may be higher than that of the semiconductor light emitting device 104 (which is 0.1 mm as indicated with (e) in the example in FIG. 4) in order to obtain sufficient light reflection by the inclined surface 401. Here, in this embodiment, resin containing phosphor or a diffusing agent is applied to a region defined by the projecting portion which is formed to surround the semiconductor light emitting element 104 as will be described later, so that the light is not extracted from the semiconductor light emitting element 104 directly to the outside but can be extracted more efficiently through a phosphor or diffusing agent. According to this method, the effective light can be obtained even with the projecting portion 202 of this embodiment. Specifically, it is conceivable that the projecting portion 202 of this embodiment may result in a reduction in the reflected light as compared to a typical reflecting member of a parabolic shape or an inverted dome shape in terms of direct reflection of light due to the shape, the height, and the like of the projecting portion. However, when the light is obtained indirectly through a phosphor or diffusing agent, most of the light is emitted in a position where a phosphor or diffusing agent exists. Hence it is possible to achieve sufficient luminous efficiency without having a large reflecting member as long as the metal thin plate 102 itself has high reflection efficiency.

Moreover, although the projecting portion 202 of this embodiment is formed into a circular shape as shown in FIG. 2, this shape is selected in view of ease of pressing and bending or of the shape of the entire module. The projecting portion 202 can be formed into any shape such as an ellipse or a quadrangle as long as such a shape allows surrounding the semiconductor light emitting element 104 and reflecting the emitted light.

Moreover, the metal thin plates 102 are exposed to the surface as described above by employing the structure in which the metal thin plates 102 protrude from the printed board 103 as shown in FIG. 1. This enables effective heat dissipation and also causing the exposed portions to serve as attaching portions when fabricating the module. This structure does not put a load on the printed board 103. Therefore, this structure leads to avoidance of risks such as disconnection of wire bonding portions, and enables a higher heat dissipation effect when being attached to a metal enclosure or the like, for example.

Next, a board is formed as the printed board by using a material such as polyimide and is stacked on upper surfaces of the metal thin plates.

Figure 7B:
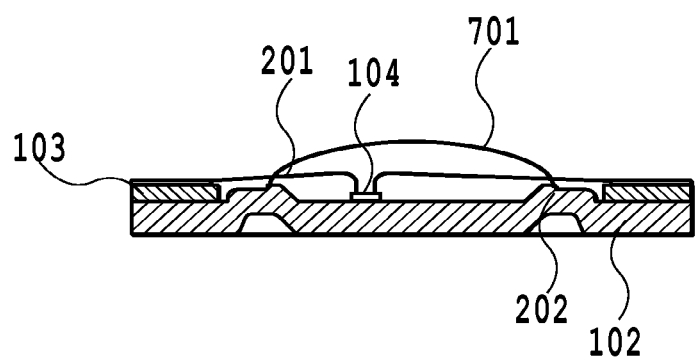
FIG. 7B is a lateral side view showing the structure of the still different example of the semiconductor light emitting module according to this embodiment.

FIGS. 7A and 7B are a front view and a lateral side view showing a structure of a still different example of the semiconductor light emitting module according to this embodiment. In the example shown in FIGS. 7A and 7B, the resin containing either a phosphor or diffusing agent is applied to the region defined by the projecting portion formed on the metal thin plate 102 so as to surround the semiconductor light emitting element 104, thereby forming a dome 701 having stable dimensional accuracy by utilizing surface tension. By forming the dome 701 according to the method described above, it is possible to reduce alight loss as compared to the conventional technique, to improve light extraction efficiency, and thereby to achieve high luminance light emission. Here, in the case of the single semiconductor light emitting element 104, it is generally preferable to form the dome 701 into a hemispherical shape. In the meantime, the semiconductor light emitting module 101 shown in FIGS. 7A and 7B mounts thereon the multiple semiconductor light emitting elements 104. As it is understood by referring to the drawings, the dome 701 of a phosphor layer is not semispherical. This is because the light loss is less likely to occur in the case of using the multiple light emitting elements as compared to the case of the single element even when the phosphor layer is not formed into a perfect hemisphere. Similarly, when an ultraviolet light emitting element is used, the dome 701 can be reduced in height since no color balancing between the light emitting element and the phosphor is required. As described above, the optimum light emitting module can be made by forming the dome 701 into an appropriate shape according to a device design.

Figure 8:
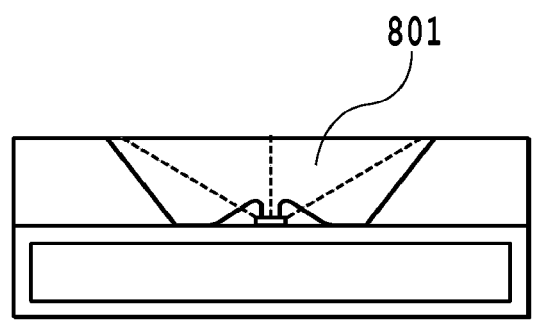
FIG. 8 is a view showing a conventional structure used for explaining an effect obtained when the method of the example of this embodiment is employed and absent in a conventional technique.

Referring to FIG. 8 showing a conventional typical structure where a phosphor or diffusing agent is formed, as compared to the conventional technique, the structure of this example shown in FIGS. 7A and 7B allows forming a phosphor or diffusing agent in a uniform structure and thereby preventing the light loss more effectively. This point will be described in more detail. In the case of the conventional typical structure where a phosphor or diffusing agent is formed shown in FIG. 8, the content of a phosphor or diffusing agent varies depending on a direction of the light emitted from the semiconductor light emitting element, which makes it difficult to obtain uniform white or diffused light. Thus, the light emitted in the direction in which the content of a phosphor or diffusing agent is large brings about a large loss accordingly and thereby causes reduction in extraction efficiency as a whole. It can be understood by referring to paths of light indicated with dashed lines in FIG. 8 that the light has to pass through a large amount of a phosphor or diffusing agent depending on the direction in the case of the conventional structure. Specifically, it is apparent that a distance to pass through a phosphor-containing resin 801 for the light emitted directly upward from the semiconductor light emitting element is different from that for the light emitted in an oblique direction. Hence it is understood that a loss is likely to occur.

To solve the conventional problem attributable to the non-uniform phosphor or diffusing agent, in this embodiment, the dome 701 is formed about the semiconductor light emitting element 104 as shown in FIG. 7B by using the resin containing a phosphor or diffusing agent so as to cause the light to pass through a uniform amount of phosphor or diffusing agent irrespective of the direction of the emitted light. A phosphor or diffusing agent is generally formed by being mixed with resin such as silicone resin or epoxy resin. However, it is extremely difficult to form the resin-made dome 701 on a plane about the semiconductor light emitting element 104 in a uniform amount.

Accordingly, in this embodiment, the circular projecting portion 202 is formed about the semiconductor light emitting element 104 on the metal thin plate 102 and the dome 701 is formed thereon by using surface tension. Hence the uniform resin layer is formed such that the distance for the light to pass through the resin may be the same. Any size, position, and shape of this projecting portion 202 are applicable as long as surface tension of the resin is available. For example, the projecting portion 202 may be formed by press work or by any other methods known in the relevant technical fields. Moreover, a similar effect can be achieved by the method shown in FIG. 3. In this case, the dome using similar surface tension may be formed by mixing binder such as silica with ink when forming a silk print portion (a double ring portion) shown in FIG. 2.

(Effects of the Semiconductor Light Emitting Module of the Present Invention)

FIG. 9 is a view showing results obtained by measuring luminance by using a mirror finish product made of rolled aluminum having total reflectivity of 75%, and the above-mentioned MIRO2 and MIRO2-Silver made by Alanod GmbH & Co. KG as materials of the reflecting plates. Here, the semiconductor light emitting elements 104 having the same properties are used as the LEDs and the domes are formed under the same conditions by using silicone resin containing a phosphor. Then, total luminous fluxes are measured by using an integrating sphere. Referring to FIG. 9, it can be understood that luminous efficiency can be improved with MIRO2-Silver twice or more as compared to that with the conventional rolled aluminum product. A lumen per watt measured when MIRO2-Silver is used is 114 lm/W, which represents luminous efficiency approximately 1.5 times as large as a current market average. This is because reflectivity of the reflecting plate influences luminous efficiency.

Specifically, the light emitted from the semiconductor light emitting element is dissipated on the phosphor contained in the resin whereby the original light and excitation light repeats reflection many times in the resin. Accordingly, a difference in the reflectivity on a reflecting surface has an extremely large influence. Referring to FIG. 10, it can be understood that the higher the reflectivity of the reflecting plate, the more the attenuation of the amount of reflected light after repetition of reflection can be suppressed. Accordingly, it can be understood that less attenuation of the reflected light leads to improvement in luminous efficiency.

FIGS. 11 to 13 are views showing results of luminous efficiency tests of this embodiment.

Next, the results shown in FIGS. 11 to 13 represent how luminous efficiency changes due to temporal changes. Now, reference is made to FIGS. 11 to 13. According to temporal change test by high-temperature and high-humidity tests, the semiconductor module of this embodiment using MIRO2-Silver maintains 90% whereas a conventional silver plated product falls below 80%. Hence it can be understood that the semiconductor module of this embodiment maintains initial luminous efficiency.

The present invention relates to a semiconductor light emitting module, an apparatus, and a method of manufacturing the same which are capable of achieving high luminance light emission by use of high electric power. The present invention can provide a semiconductor light emitting module, an apparatus, and a method of manufacturing the same which are capable of achieving high luminance while preventing deterioration in a luminance property even when a large current is applied, by means of efficiently dissipating heat generated from a light emitting element and thereby suppressing an increase in temperature.

Second Embodiment

Figure 14A:
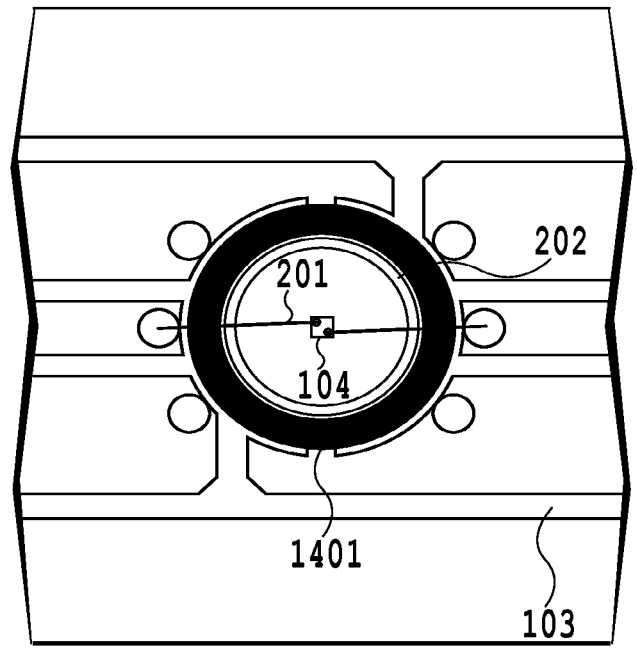
FIG. 14A is a front view showing a structure of a different example of the semiconductor light emitting module according to this embodiment.
Figure 14B:
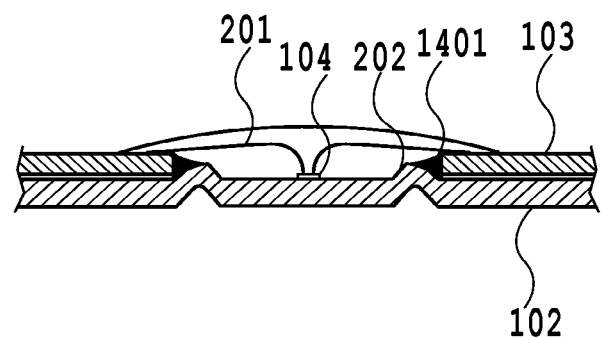
FIG. 14B is a lateral side view showing the structure of the different example of the semiconductor light emitting module according to this embodiment.

FIGS. 14A and 14B are a front view and a lateral side view showing a structure of an example of a semiconductor light emitting module according to this embodiment. As similar to the above-described first embodiment, a semiconductor module of this embodiment similarly forms therein the projecting portion 202 serving as the reflecting member on the metal thin plate 102 in a way that the projecting portion 202 surrounds the semiconductor light emitting element 104, and connects the semiconductor light emitting element 104 to the printed board 103 by using the wire 201 or the like, for example, but is different in that a high reflection paint portion 1401 is provided at a gap portion between the printed board covering the metal thin plate 102 and the projecting portion 202 as shown in FIG. 14B.

Specifically, the printed board 103 having an opening for the projecting portion 202 is formed so as to be stacked on the metal thin plate 102 in the first embodiment. Here, as can be understood by referring to the lateral side view in FIG. 14B, the projecting portion 202 is located slightly lower than the printed board 103 and a slight clearance is formed between the projecting portion 202 and the printed board 103 due to the above-described structure. If no processing is performed on this portion, in the worst case, none of or only a little proportion of the light reaching this gap portion out of the light emitted from the semiconductor light emitting element 104 may be utilized.

Figure 17:
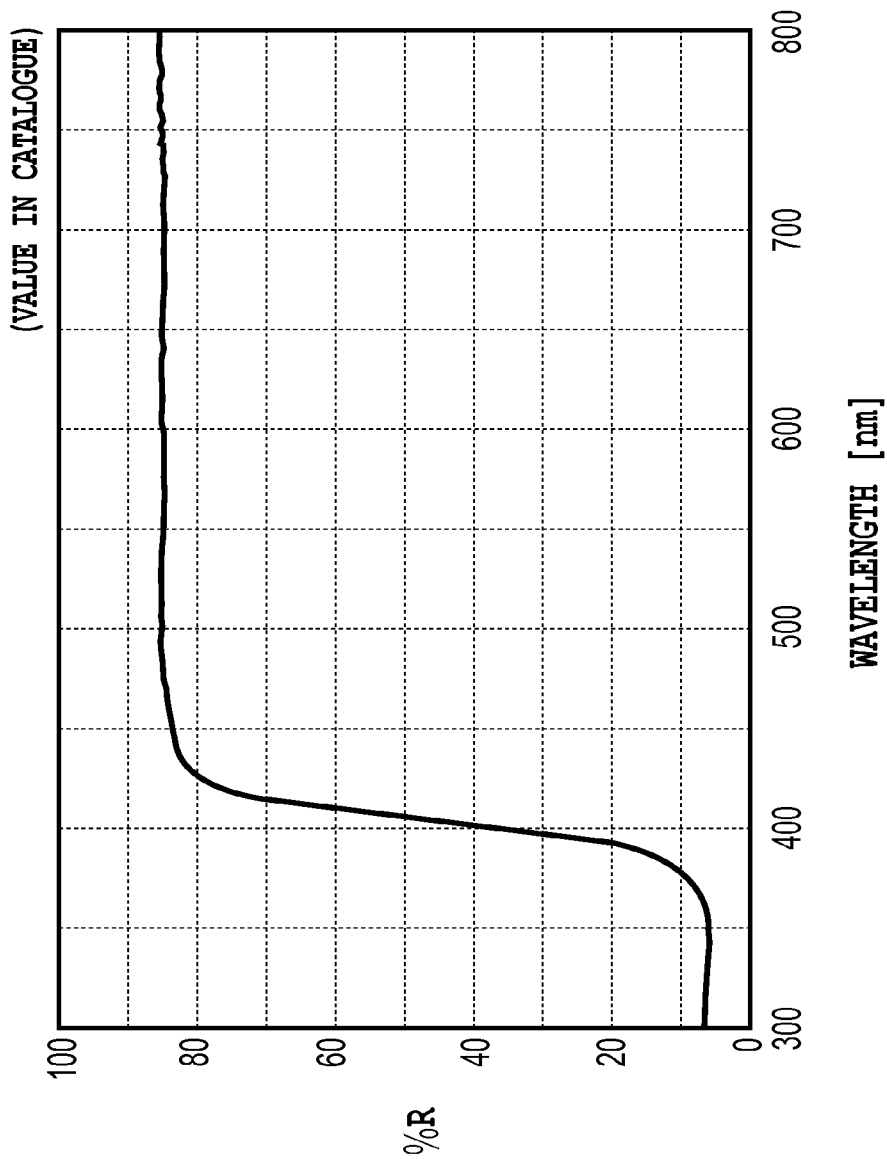
FIG. 17 is a view showing measured values of reflectivity for each wavelength of Photofiner PSR-4000 LEW1/CA-40 LEW1 used in this embodiment.

In this embodiment, the high reflection paint portion 1401 is formed by disposing high reflection paint at the above-described gap portion, thereby reflecting all of the light that reaches the high reflection paint portion 1401 and enhancing reflection efficiency. As for the paint used in this embodiment, Photofiner PSR-4000 LEW1/CA-40 LEW1 made by Taiyo Ink Mfg. Co., Ltd. may be used, for example. However, without limitation to the foregoing, any paint having a high reflection property which is known in the relevant technical fields may be used. FIG. 17 shows measured values of reflectivity for each wavelength of Photofiner PSR-4000 LEW1/CA-40 LEW1. The values are measured under a condition where the paint is applied directly on a copper plate with a film thickness of 23 μm. Referring to FIG. 17, it can be understood that the paint has reflectivity relative to light in a wavelength region mainly assumed in this embodiment equal to or above 82%, which indicates a favorable reflection property. Note that, in addition to the specific commercially available paint as described above, it is also possible to use, as the high reflection paint for the gap portion, a mixed material of hybrid resin with an appropriate amount of white titanium oxide.

The above-described high reflection paint may be applied with methods known in the relevant technical fields such as stamping (stamping transfer) or coating by use of a dispenser after forming the projecting portion 202 and stacking the printed board 103 as similar to the above-described first embodiment, for example. However, stamping is suitable in view of costs. Moreover, inkjet coating may be used. Coating may be performed with an appropriate method selected in accordance with costs and usage environments. In this way, the semiconductor light emitting element 104 is disposed after stamping or coating the high reflection paint and then the wire 201 is connected. The subsequent manufacturing processes are similar to those in the first embodiment. Meanwhile, as can be understood by referring to the lateral side view shown in FIG. 14B, a moderate dent is formed in the made high reflection paint portion as a result of surface tension or the like, causing the high reflection paint portion to have a shape by which light is more likely to be reflected upward. In fact, when luminance values are measured in the cases with and without the high reflection paint portion 1401, the semiconductor light emitting module not including the high reflection paint portion 1401 has a luminance of 5.3 lumens while the semiconductor light emitting module including the high reflection paint portion 1401 has a luminance of 7.3 lumens.

Figure 18A:
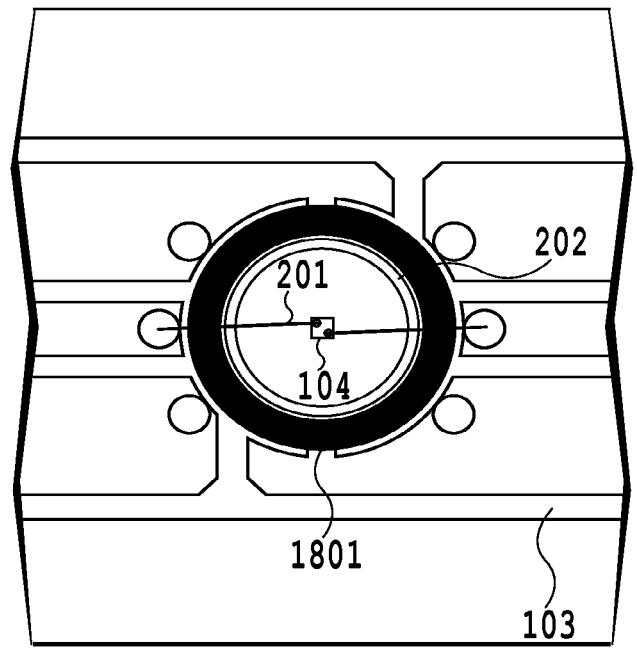
FIG. 18A is a front view showing a structure of a still different example of the semiconductor light emitting module according to this embodiment.
Figure 18B:
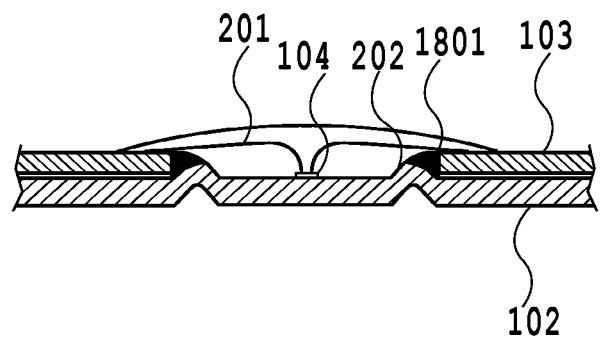
FIG. 18B is a lateral side view showing the structure of the still different example of the semiconductor light emitting module according to this embodiment.

Next, a different example of a method of coating the high reflection paint will be described. FIGS. 18A and 18B are a front view and a lateral side view showing a structure of the different example of the semiconductor light emitting module according to this embodiment. In this embodiment, the high reflection paint is similarly disposed at the gap portion; however, a paint portion is formed into a convex shape as seen in a high reflection paint portion 1801 of FIG. 18B. Thus, reflection efficiency equivalent to that of the concave high reflection paint portion 1401 as shown in FIG. 14B is obtained.

As described above, by applying the high reflection paint to the portion where the projecting portion 202 contacts the printed board 103, it is possible to achieve high reflectivity and higher illuminance without wasting the light reaching that portion.

Third Embodiment

Figure 15A:
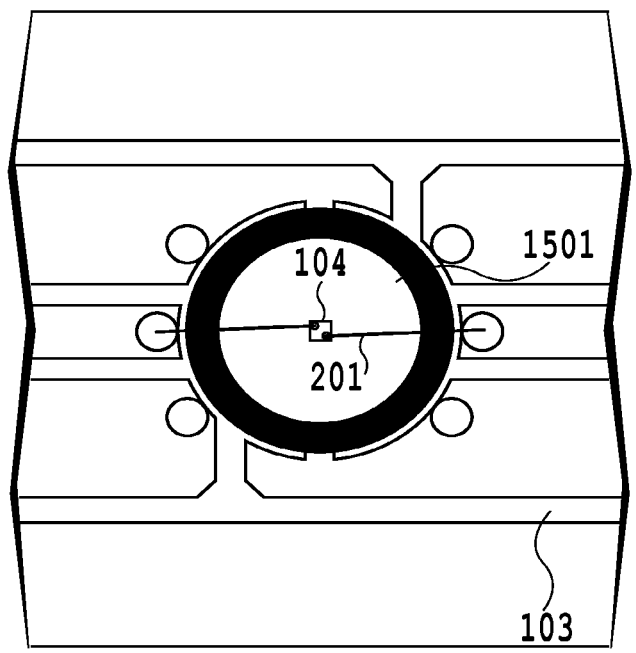
FIG. 15A is a front view showing a structure of a still different example of the semiconductor light emitting module according to this embodiment.
Figure 15B:
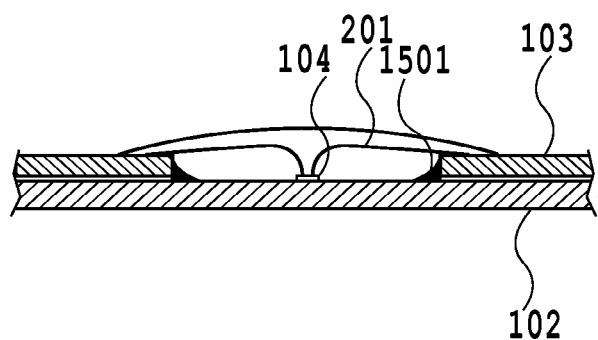
FIG. 15B is a lateral side view showing the structure of the still different example of the semiconductor light emitting module according to this embodiment.

FIGS. 15A and 15B are a front view and a lateral side view showing a structure of an example of a semiconductor light emitting module according to this embodiment. The semiconductor module of this embodiment is similar to the above-described second embodiment in that the a high reflection paint portion 1501 is provided at an edge portion of an opening of the printed board 103 to cover the metal thin plate 102 and is different from the second embodiment in that the metal thin plate 102 does not include the projecting portion 202 serving as the reflecting member provided so as to surround the semiconductor light emitting element 104.

Specifically, in the second embodiment, the printed board 103 having an opening for the projecting portion 202 is formed to be stacked on the metal thin plate 102 and the inclined surface of the projecting portion 202 plays a role as a reflecting plate to increase reflection efficiency. Meanwhile, as can be understood by referring to the lateral side view shown in FIG. 14B, the high reflection paint portion 1401 merely plays a supporting role in the above-described reflecting plate structure. In this embodiment, the high reflection paint portion 1501 is formed on a planar portion of the metal thin plate 102 instead of the projecting portion, thereby making the paint portion have a shape closer to the reflecting plate.

This embodiment allows providing the semiconductor module capable of achieving high reflectivity without the projecting portion by utilizing this structure. Here, as for the paint applicable to this embodiment, Photofiner PSR-4000 LEW1/CA-40 LEW1 made by Taiyo Ink Mfg. Co., Ltd. may be used, for example. However, without limitation to the foregoing, any paint having a high reflection property which is known in the relevant technical fields may be used. As explained in the above-described first embodiment, a phosphor or the like can be ultimately used as an included member in this embodiment. Accordingly, a certain light emitting effect can be obtained without the projecting portion 202 as in the first and second embodiments. Here, in addition to the specific commercially available paint as described above, it is also possible to use, for the gap portion, a mixed material of hybrid resin with an appropriate amount of white titanium oxide as the high reflection paint.

The above-described high reflection paint may be applied with methods known in the relevant technical fields such as stamping (transcription) or coating by use of a dispenser after stacking the printed board 103 without forming the projecting portion 202 unlike the above-described second embodiment, for example. However, stamping is suitable in view of costs. Moreover, inkjet coating may be used. Coating may be performed with an appropriate method selected in accordance with costs and usage environments. In this way, the semiconductor light emitting element 104 is disposed after stamping or coating the high reflection paint and then the wire 201 is connected. The subsequent manufacturing processes are similar to those in the first embodiment.

Figure 19A:
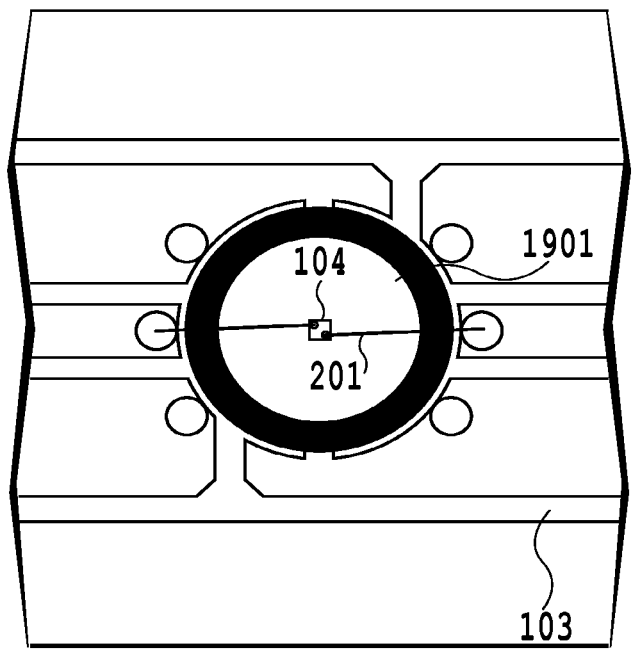
FIG. 19A is a front view showing a structure of a still different example of the semiconductor light emitting module according to this embodiment.
Figure 19B:
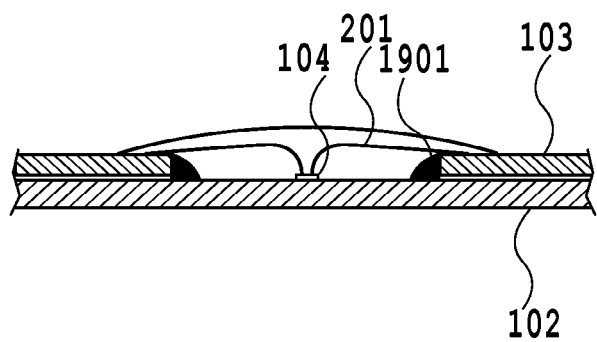
FIG. 19B is a lateral side view showing the structure of the still different example of the semiconductor light emitting module according to this embodiment.

Next, a different example of the method of coating the high reflection paint will be described as similar to the second embodiment. FIGS. 19A and 19B are a front view and a lateral side view showing a structure of the different example of the semiconductor light emitting module according to this embodiment. Although the high reflection paint is disposed at the gap portion similarly in this example, reflection efficiency equivalent to that of the concave high reflection paint portion 1501 as shown in FIG. 15B can be obtained by forming a paint portion into a convex shape like a high reflection paint portion 1901 in FIG. 19B.

As described above, by applying the high reflection paint to the edge portion of the opening of the printed board 103, it is possible to achieve high reflectivity and higher illuminance without providing the projecting portion and wasting the light reaching that portion and at lower costs. In fact, it is confirmed that there is very little difference in luminance between the semiconductor module of the second embodiment and the semiconductor module of this embodiment.

Fourth Embodiment

Figure 6:
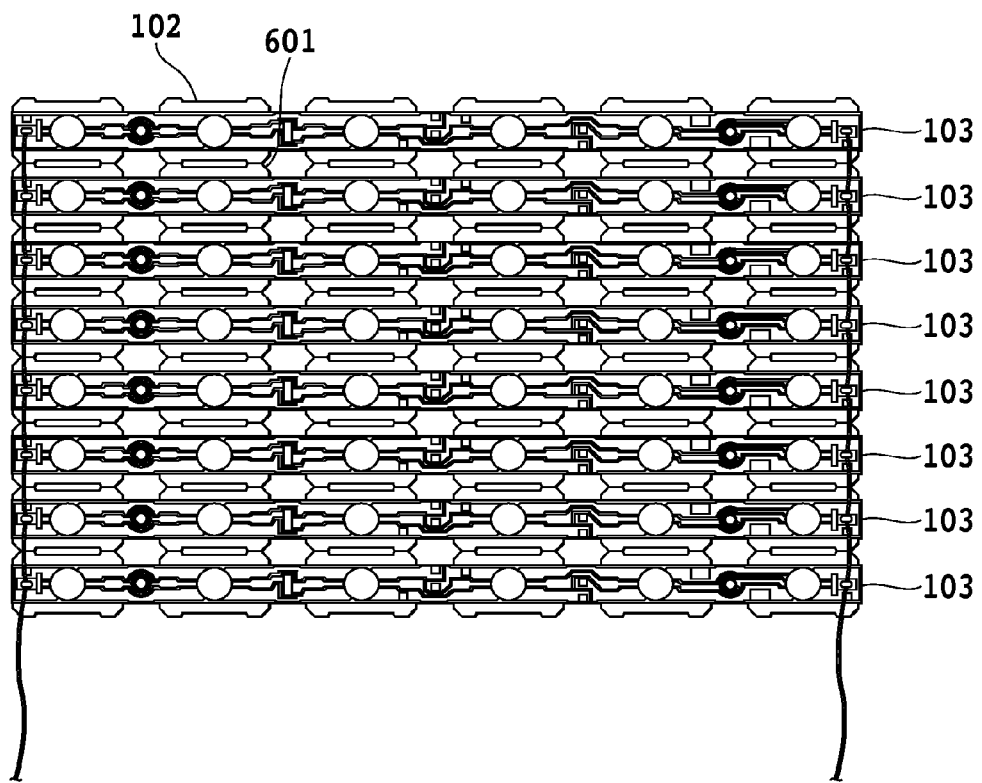
FIG. 6 is a top view showing a semiconductor light emitting module of a planar shape according to an embodiment of the present invention.

FIG. 6 is a top view of a semiconductor light emitting module of this embodiment. Instead of the array-shaped single row as in the above-described first embodiment, the semiconductor module of this embodiment has a pattern as shown in FIG. 6 in which a light emitting diode module in a planar shape is formed by multiple rows.

By forming the semiconductor module as described above, it is possible not only to realize a high luminance module as a plane but also to produce a light source module having a pseudo curved surface by bending the module at connectors 601 for laterally connecting the metal thin plates 102 to each other.

Moreover, it is possible to prevent warpage attributable to a difference in the coefficient of thermal expansion in bonding with a thermosetting adhesive, for example, by attaching in a lattice form the multiple metal plates connected by use of the connectors 601 and the multiple printed boards. It is also possible to form the array-shaped module of the first embodiment after producing the lattice-shaped module as in this embodiment by cutting the module apart at the connectors 601. The semiconductor light emitting module at lower costs may be provided by employing the manufacturing method and the structure described above.

Fifth Embodiment

Figure 20A:
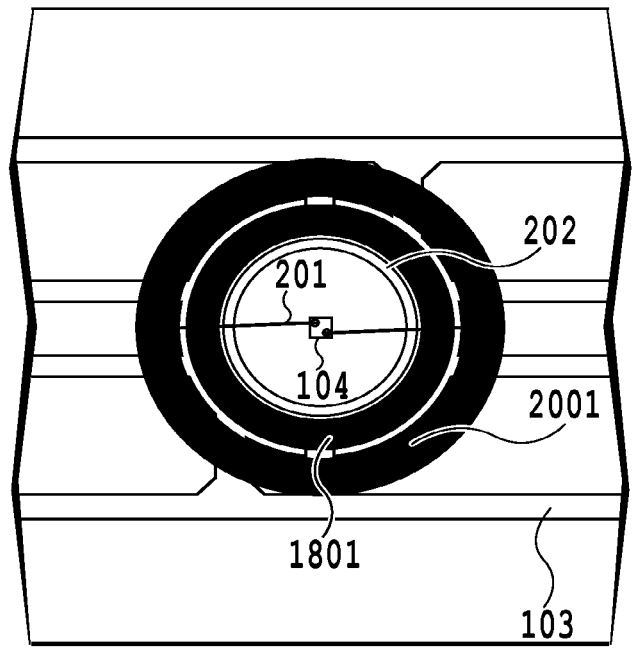
FIG. 20A is a front view showing a structure of a still different example of the semiconductor light emitting module according to this embodiment.
Figure 20B:
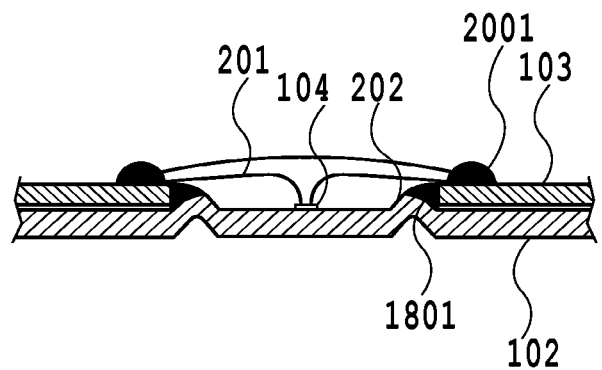
FIG. 20B is a lateral side view showing the structure of the still different example of the semiconductor light emitting module according to this embodiment.

FIGS. 20A and 20B are a front view and a lateral side view showing a structure of an example of a semiconductor light emitting module according to this embodiment. The semiconductor module of this embodiment is similar to the above-described second and third embodiments in light of the basic structure including provision of the high reflection paint portion 1501 at the edge portion of the opening of the printed board 103 for covering the metal thin plate 102 and the like, but is different therefrom in that a dam 2001 (dam shape parts) is further provided so as to surround an entire light emitting unit including the semiconductor light emitting element.

Specifically, the high reflectivity is obtained because the light which would conventionally leak out of the gap can be utilized by the high reflection paint portion 1401 and the like in the second and third embodiments. In addition thereto, in this embodiment, the light which would leak out at a peripheral portion of the dome 701 can also be utilized by providing the dam 2001 with the high reflection paint around the dome 701. The dam 2001 can be formed in accordance with a method similar to that for the high reflection paint portion 1401 and the like by using the above-described high reflection paint. Alternatively, any method known in the relevant technical fields is applicable.

After forming the dam 2001 in the above manner, the module may be produced by filling the resin similarly to any one of the above-described embodiments.

Figure 21:
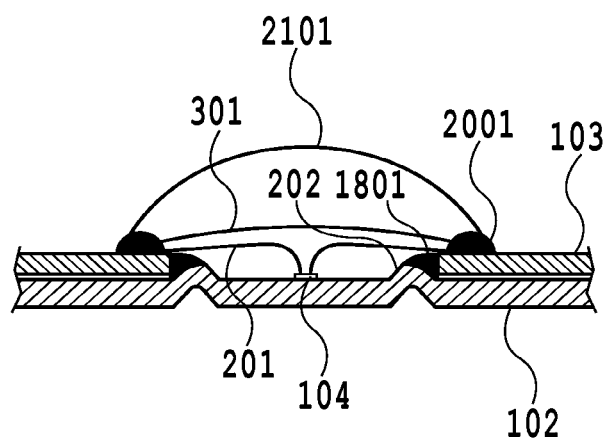
FIG. 21 is a lateral side view showing a structure of a still different example of the semiconductor light emitting module according to this embodiment.

Meanwhile, only the low dome similar to that of the first embodiment is formed in FIG. 20B. However, by forming the dam 2001 as shown in FIG. 21, in the case of a single color light emitting product using transparent resin, a higher dome such as a dome 2101 as shown in FIG. 21 may be formed by surface tension occurring when the resin is filled thereafter. Operation of a directional characteristic of the light is possible by forming the high dome as described above. While epoxy resin, silicon resin, or the like is used as the resin, a similar effect can be obtained by fixing a resin molded product with epoxy resin, silicone resin, or a translucent adhesive. Note that, if the dome is formed only by use of the resin containing the phosphor, the effect of controlling the directional characteristic of light is limited because the light remains the diffused light. In the case of the white light emission, the operation of the directional characteristic is made possible by limiting sealing with the phosphor-containing resin up to a conventional height and further forming the dome on an upper surface thereof by using transparent resin. Alternatively, the dome may be formed by using a casting case and the like.

Figure 22:
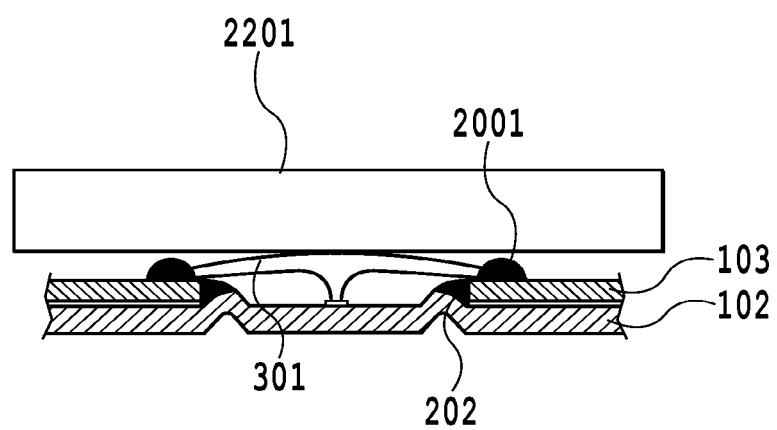
FIG. 22 is a lateral side view showing a structure of a still different example of the semiconductor light emitting module according to this embodiment.

Furthermore, it is also possible to use a light guide plate 2201 shown in FIG. 22 instead of the high dome 2101. Specifically, as shown in FIG. 22, the light conventionally emitted in a horizontal direction relative to a board can be directed in a perpendicular direction by forming the convex dam 2001 with the high reflection paint (resin) and then performing resin sealing (containing the phosphor) 301. This reduces the light loss occurring when the light is incident on the light guide plate, for example.

Figure 23:
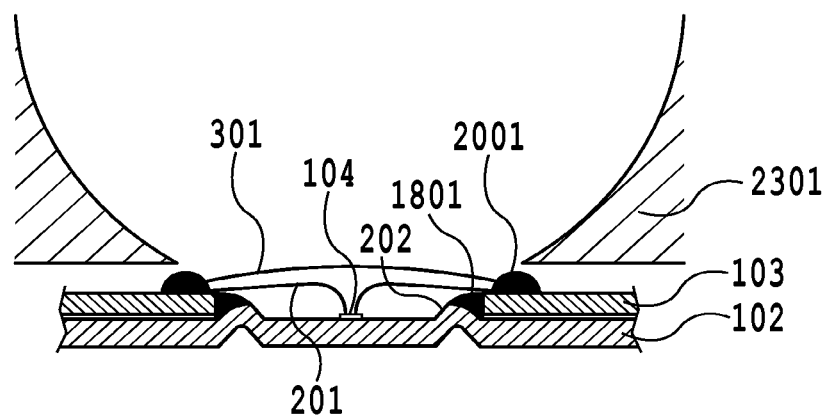
FIG. 23 is a lateral side view showing a structure of a still different example of the semiconductor light emitting module according to this embodiment.

Meanwhile, a silver-deposited reflector 2301 shown in FIG. 22 may be used instead of the light guide plate 2201. Specifically, as shown in FIG. 23, light is condensed by using the silver-deposited reflector 2301 in combination, for example, by forming the convex dam 2001 with the high reflection paint (resin) and then performing resin sealing (containing the phosphor). This makes a luminous point smaller and thereby makes an inside diameter of the reflector 2301 smaller than that of the conventional resin dome, thus facilitating light-condensing design. In this way, it is easier to design condensation of light. Meanwhile, when a conductive component such as the conventional silver-deposited reflector 2301 is used in combination, an insulating sheet is attached or a sufficient clearance is provided between the conventional silver-deposited reflector or the like and the printed board for the purpose of insulation from a circuit pattern on the printed board. Hence there are problems of increases in the number of steps and material costs, occurrence of a light loss, and so forth. However, since the convex dam 2001 is made of an insulative material as in this example, it is not necessary to provide an excessive clearance and efficient light extraction can be realized without extra costs.

As described above, according to this embodiment, it is possible to expect the reflectivity which is even higher than the reflectivity of the above-described embodiments. As a result of actual measurement, luminance by using the module having the shape in FIG. 14B is 7.3 lumens as described previously whereas the example in FIG. 20B can obtain luminance as high as 8.0 lumens.

INDUSTRIAL APPLICABILITY

The present invention can provide a semiconductor light emitting module and a method of manufacturing the same that allow maintaining higher reflectivity, improving light extraction efficiency, and thereby achieving high luminance light emission as well as lightweight and thin profile. Here, the semiconductor light emitting module includes a high reflection plate on which each semiconductor light emitting element is disposed in a way to contact a surface thereof, and a board covering a surface of the reflection plate in a given portion excluding a portion for each semiconductor light emitting element and a neighborhood of the element, being electrically connected to each semiconductor light emitting element, and serving as an electrode to supply electric power, the board being formed in a way to have an area smaller than that of the high reflection plate so as to partially expose the high reflection plate.

The invention claimed is:
1. A semiconductor light emitting device comprising:
a plurality of semiconductor light emitting modules; and
a heat dissipation plate,
wherein each semiconductor light emitting module includes a single board to which a plurality of plates are attached,
wherein each plate disposes a semiconductor light emitting element in contact with a surface of the each plate;
wherein the single board is electrically connected to each semiconductor light emitting element disposed on the each plate and supplies electric power to the each semiconductor light emitting element, wherein the single board covers a second portion within a first surface of the each plate excluding a first portion, the first portion being the semiconductor light emitting element and the neighborhood of the semiconductor lighting emitting element, and wherein a second surface of the each plate excluding the second portion is exposed; and wherein the heat dissipation plate includes cut-and-bent portions, the cut-and-bent portions being formed by incising parts of the heat dissipation plate to bend up edges of the parts of the heat dissipation plate, the cut-and-bent portions sandwich the exposed second surface of the each plate and a base surface of the each plate so that the base surface of the each plate closely contacts the heat dissipation plate.

2. The semiconductor light emitting device according to claim 1, wherein the each plate has a high reflection coating formed on the surface thereof so as to reflect light from the each semiconductor light emitting element.

3. The semiconductor light emitting device according to claim 1, wherein the plurality of plates are disposed in an array form, and a width of each of the plurality of plates longitudinally arranged in the array form is greater than a width of the single board.

* * * * *